(12) United States Patent
Mostafa et al.

(10) Patent No.: US 10,128,856 B1
(45) Date of Patent: Nov. 13, 2018

(54) DIGITAL LOCKING LOOP CIRCUIT AND METHOD OF OPERATION

(71) Applicant: Marvell International Ltd., Hamilton (BM)

(72) Inventors: Ahmed Hesham Mostafa, San Jose, CA (US); Manisha Gambhir, Cupertino, CA (US); Myung Jae Yoo, Sunnyvale, CA (US); Zubir Adal, Union City, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/908,329

(22) Filed: Feb. 28, 2018

Related U.S. Application Data

(60) Provisional application No. 62/464,725, filed on Feb. 28, 2017.

(51) Int. Cl.
*H03L 7/087* (2006.01)
*H03L 7/08* (2006.01)

(52) U.S. Cl.
CPC ............ *H03L 7/087* (2013.01); *H03L 7/0802* (2013.01)

(58) Field of Classification Search
CPC .............................. H03L 7/0802; H03L 7/087
See application file for complete search history.

(56) References Cited

U.S. PATENT DOCUMENTS

| 7,898,306 | B1 | 3/2011 | Cheng | |
| 8,106,808 | B1* | 1/2012 | Cohen | G04F 10/005 341/155 |
| 8,331,520 | B2* | 12/2012 | Ueda | H03L 7/0802 375/376 |
| 8,344,772 | B2* | 1/2013 | Lee | H03L 7/085 327/150 |
| 8,638,146 | B1* | 1/2014 | Lamanna | H03L 7/085 327/156 |
| 8,957,705 | B2* | 2/2015 | Jia | G04F 10/005 327/12 |
| 2017/0366191 | A1 | 12/2017 | Wang et al. | |
| 2017/0366376 | A1 | 12/2017 | Wang et al. | |

* cited by examiner

*Primary Examiner* — Patrick O'Neill

(57) ABSTRACT

A digital locking loop circuit (DLLC), such as a digital phase-locked loop or digital delay-locked loop, includes a digitally-controlled frequency generator, a digital loop filter configured to output a digital control signal for the frequency generator, and a multi-stage time-to-digital converter to detect phase error between an input reference clock signal and an output signal fed back from the frequency generator, to adjust the digitally-controlled frequency generator to decrease the phase error. Each phase-error detection stage detects a phase error component at a respective resolution, and combinatorial logic combines the components into a phase error signal. The plurality of stages may operate in parallel to provide different portions of the phase error signal. The DLLC may include a fractional phase interpolator to adjust the target frequency by a fractional amount, and one of the stages includes conversion circuitry to compensate for a fractional phase. A method also is provided.

20 Claims, 5 Drawing Sheets

DIGITAL LOCKING LOOP CIRCUIT AND METHOD OF OPERATION

CROSS REFERENCE TO RELATED APPLICATION

This claims the benefit of commonly-assigned U.S. Provisional Patent Application No. 62/464,725, filed Feb. 28, 2017, which is hereby incorporated by reference herein in its entirety.

FIELD OF USE

This disclosure relates to a digital locking loop circuit with quantized phase-error detection for faster locking times.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

Locking loop circuits include phase-locked loops (PLLs) and delay-locked loops (DLLs). Both types of locking loop circuits use some type of error detector to determine phase error and/or frequency error in the output signal to adjust the loop to correct the error. For example, many digital phase-locked loops (DPLLs) employ a phase-error detector, such as a Bang-Bang phase detector, that merely indicates whether the phase needs to be advanced or retarded.

However, such DPLLs require relatively long locking times. For applications requiring short (i.e., fast) locking times, a phase-error detector that provides a quantized indication of phase error, with good resolution, is needed.

However, such a phase-error detector, which may be implemented as a time-to-digital converter (TDC), would need to be wide—i.e., encompass a large number of bits. A TDC may be implemented as a delay chain, with one inverter per bit. Each inverter would need its own ancillary circuitry, including power, clocks, etc. Therefore, there could be substantial area and power penalties to provide a wide TDC.

SUMMARY

A digital locking loop circuit according to implementations of the subject matter of this disclosure includes a digitally-controlled frequency generator, a digital loop filter configured to output a digital control signal for inputting to the digitally controlled frequency generator, and a multi-stage time-to-digital converter configured to detect phase error between an input reference clock signal and an output signal fed back from the digitally-controlled frequency generator. The multi-stage time-to-digital converter is further configured to output the phase error as a control input to the digital loop filter, to cause the digital control signal output by the digital loop filter to adjust the digitally-controlled frequency generator to decrease the phase error. The multi-stage time-to-digital converter includes a plurality of phase-error detection stages, each respective phase-error detection stage being configured to detect a respective phase error component at a respective resolution, and combinatorial logic configured to combine the respective phase error components into a phase error signal.

In some implementations of such a digital locking loop circuit, the plurality of phase-error detection stages includes a first phase-error detection stage configured to detect phase error at a first resolution that is integer multiples of a time period of the output signal fed back from the digitally-controlled frequency generator, a second phase-error detection stage configured to detect phase error at a second resolution that is a coarse fraction of the time period of the output signal fed back from the digitally-controlled frequency generator, and a third phase-error detection stage configured to detect phase error at a third resolution that is a fine fraction of the time period of the output signal fed back from the digitally-controlled frequency generator, the fine fractions being smaller than the coarse fractions.

In a variant of such an implementation of a digital locking loop circuit, the output signal fed back from the digitally-controlled frequency generator includes a plurality of output phases, the second phase-error detection stage operates on the plurality of output phases, and the coarse fraction comprises a respective period of one the output phases.

In such a variant of such an implementation of a digital locking loop circuit, the first phase-error detection stage and the third phase-error detection stage both operate on a particular one of the plurality of output phases.

In that variant, the digitally-controlled frequency generator is a digitally-controlled oscillator configured to change its frequency in response to a digital control signal. whereby the digital locking loop circuit is a digital phase-locked loop circuit having an adjustable target frequency. The digital phase-locked loop circuit further includes a fractional phase interpolator on the particular one of the plurality of output phases. The fractional phase interpolator is configured to adjust the target frequency by a fractional amount, and the second stage includes conversion circuitry configured to compensate for a fractional phase on the particular one of the plurality of output phases. The conversion circuitry may be configured to determine a phase error attributable to the fractional phase interpolator and a delay attributable to the fractional phase interpolator.

In such a variant of such an implementation of a digital locking loop circuit, the coarse fraction may bears a particular proportion to the time period, and the fine fraction may bear that particular proportion to the coarse fraction.

In such a variant of such an implementation of a digital locking loop circuit, the plurality of stages may operate in parallel to provide different portions of the phase error signal.

In some implementations of such a digital locking loop circuit, the digitally-controlled frequency generator may be a digitally-controlled oscillator, whereby the digital locking loop circuit is a digital phase-locked loop circuit having an adjustable target frequency. The digital phase-locked loop circuit may further include a fractional phase interpolator configured to adjust the target frequency by a fractional amount, by shifting an edge of at least one cycle of the output signal fed back from the digitally-controlled oscillator. At least one stage of the plurality of stages may include conversion circuitry configured to compensate for a fractional phase on the output signal fed back from the digitally-controlled oscillator.

In some implementations of such a digital locking loop circuit, the plurality of stages may operate in parallel to provide different portions of the phase error signal.

In some implementations of such a digital locking loop circuit, the digitally-controlled frequency generator may be a digitally-controlled oscillator configured to change its frequency in response to a digital control signal, whereby the digital locking loop circuit is a digital phase-locked loop circuit.

In some implementations of such a digital locking loop circuit, the digitally-controlled frequency generator may be a digital delay line including a plurality of controllable delay elements, whereby the digital locking loop circuit is a digital delay-locked loop circuit.

A method according to implementations of the subject matter of this disclosure for controlling a digital locking loop circuit includes detecting phase error at a first resolution that is integer multiples of a time period of a feedback signal of the digital locking loop circuit, detecting phase error at a second resolution that is a coarse fraction of the time period of the feedback signal of the digital locking loop circuit, detecting phase error at a third resolution that is a fine fraction of the time period of the feedback signal of the digital locking loop circuit, the fine fractions being smaller than the coarse fractions, and combining the phase error at the first resolution, the phase error at the second resolution, and the phase error at the third resolution, into a phase error signal that is a control input to the digital locking loop circuit.

In some implementations of such a method, detecting phase error at the second resolution comprises operating on a plurality of output signal phases, and the coarse fraction includes a respective period of one the output signal phases.

In a variant of such an implementation, both the detecting phase error at the first resolution, and the detecting phase error at the third resolution, may include operating on a particular one of the plurality of output phases. Such a variant may further include interpolating a fractional phase of the particular one of the plurality of output phases fed back from the digitally-controlled oscillator by shifting an edge of at least one cycle of the particular one of the plurality of output phases, to adjust the target frequency by a fractional amount, where detecting phase error at the second resolution further includes compensating for the fractional phase on the particular one of the plurality of output phases. The compensating for the fractional phase may include determining a phase error attributable to interpolation of the fractional phase and a delay attributable to interpolation of the fractional phase.

In other implementations of such a method the detecting phase error at the first resolution, the detecting phase error at the second resolution, and the detecting phase error at the third resolution, may be performed in parallel to provide different portions of the phase error signal.

Other implementations of such a method may further include interpolating a fractional phase on the feedback signal of the digital locking loop circuit by shifting an edge of at least one cycle of the feedback signal, where the generating a control input comprises compensating for the fractional phase on the feedback signal of the digital locking loop circuit. In such an implementation, the compensating for the fractional phase may include determining a phase error attributable to interpolation of the fractional phase and a delay attributable to interpolation of the fractional phase.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
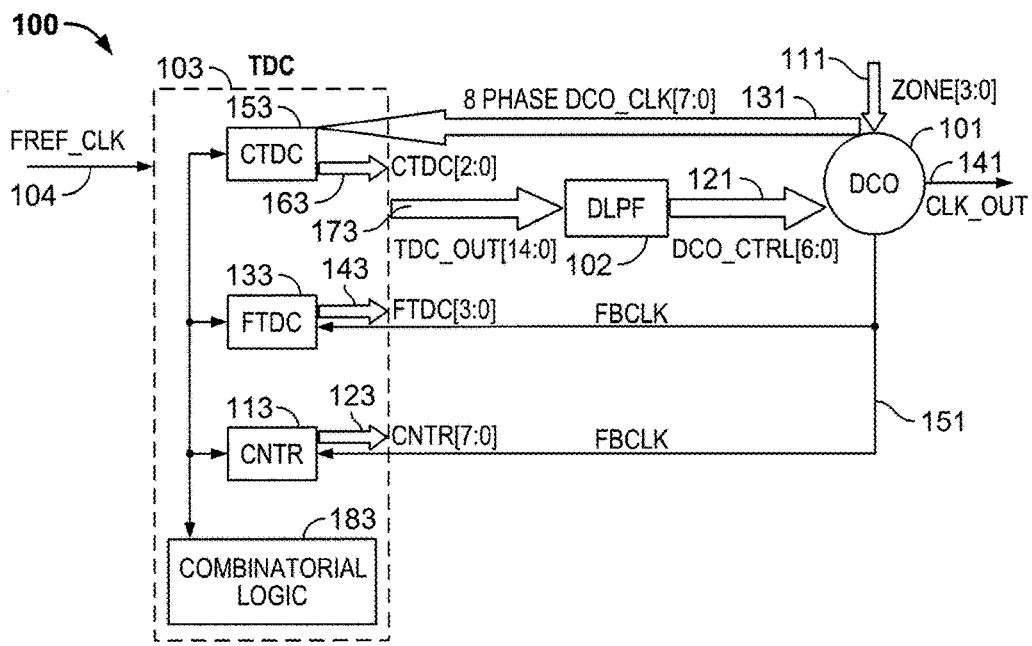
FIG. 1 is a block diagram showing a first implementation of a digital phase-locked loop circuit according to the subject matter of this disclosure.

As set forth above, some applications require a locking loop circuit with fast locking times, therefore requiring a phase-error detector that provides a high-resolution quantized indication of phase error. Known quantized phase-error detectors, implemented as TDCs based on delay chains, incur a high penalty in terms of area and power consumption.

For simplicity, the discussion that follows will concentrate on digital phase-locked loops. However, this disclosure applies equally to both digital phase-locked loops and digital delay-locked loops, except where noted otherwise. In accordance with implementations of the subject matter of this disclosure, a DPLL includes a digitally-controlled oscillator, a phase-error detector in the form of a modified TDC (as described below), and a digital loop filter. The DCO may cover a wide frequency range. For example, if the DPLL is used in the read channel of a hard disk drive, the frequency range will encompass the different frequencies at the inner and outer radii of the rotating platter, resulting from the different linear velocities at those radii regardless of the particular angular velocity of the platter. There can be a factor of two difference or more between the lower and upper frequencies. The DCO may have one control input that determines a smaller frequency range in which the loop is intended to operate, and another control input from the loop filter that determines the specific target output frequency. The DCO generates a multiphase clock output, including the final loop output. One of the output clock phases is the feedback clock to the TDC. For digital delay-locked loops, the DCO may be replaced by a digital delay line including a plurality of controllable delay elements.

The digital loop filter may be a high-accuracy, low-latency digital filter that can be used to define the loop bandwidth and the loop phase margin in relation to the reference clock, based on the selected filter coefficients. The digital loop filter outputs a digital control word to adjust the DCO frequency based on the phase error information that is received from the TDC.

A TDC according to implementations of the subject matter of this disclosure includes several stages that operate in parallel. Each stage has a different range, to measure a different resolution of the phase error. A counter (CNTR) stage is the coarsest stage, and records a count value at the reference clock rising edge. A target count for a lock is then determined, and the continuing count is compared to the target count to determine the number of integer clock periods between a rising edge of the loop feedback clock and a rising edge of the reference clock. Alternatively, in other implementations, the counter may be started at the feedback clock rising edge, and then the counter directly outputs the integer number of feedback clock periods between the feedback clock rising edge and the reference clock rising edge.

A coarse TDC (CTDC) stage quantizes the phase error, within one feedback clock period, to the phases of the DCO output clock. That is, the CTDC records a phase value at the reference clock rising edge. A target phase for a lock is then determined, and the continuing phase value output is compared to the target phase to determine the integer number of phases between a rising edge of the loop feedback clock and the target phase. Alternatively, in other implementations, the CTDC may be started at the feedback clock rising edge, and then the CTDC directly outputs the integer number of phases between the target and the most recent rising edge of the feedback clock. A fine TDC (FTDC) stage has the finest resolution among the TDC stages according to implementations of this invention, and measures fractions of a single clock phase. In some implementations, the FTDC stage may be similar in structure to a previously-known TDC which, as is well known, may be a simple tapped delay line.

A first implementation of a DPLL 100 according to the subject matter of this disclosure is shown in FIG. 1. In this implementation, the DCO outputs eight phases in every clock period T. Therefore, the CTDC is quantized to units of T/8. The FTDC is quantized in fractions of a phase; in this implementation the fraction is also ⅛, so that the FTDC is quantized to units of T/64.

As noted above, in this implementation, DCO 101 may cover a wide frequency range. Control input (ZONE) 111 is a signal that determines a smaller frequency range, within that wider range, in which the loop is intended to operate. For example, a 4-bit control input will provide up to sixteen different smaller ranges within the wide range; in an implementation according to the subject matter of this disclosure there are nine ranges. Digital loop filter (DLPF) 102 provides another control input (DCO_CTRL) 121 (7 bits in this example) to DCO 101 that determines the specific target output frequency of DCO 101. DCO 101 generates a multiphase clock output (DCO_CLK) 131, including the final loop output (CLK_OUT) 141. One of the output phases of clock output 131 is the feedback clock (FBCLK) 151 to the TDC 103. In this implementation, the same output phase (e.g., Phase '0') may be used as both the final loop output (CLK_OUT) 141 and the feedback clock (FBCLK) 151, although different phases can be used for CLK_OUT 141 and FBCLK 151.

TDC 103 compares FBCLK 151 to reference clock (FREF_CLK) 104. According to implementations of the subject matter of this disclosure, TDC 103 includes CNTR stage 113 which has FBCLK 151 as an input and which outputs a signal 123 (8 bits wide in this example), FTDC stage 133 which also has FBCLK 151 as an input and which outputs a signal 143 (4 bits wide in this example), and CTDC stage 153 which has multiphase clock output 131 as an input and which outputs a signal 163 (3 bits wide in this example). Signals 123, 143 and 163 are combined, as described below, to yield a TDC output signal (TDC_OUT) 173 (15 bits in this example) to signify the phase error to DLPF 102 so that DLPF 102 can output DCO control input (DCO_CTRL) 121 to adjust the output frequency.

TDC CNTR stage 113 is used to quantize the phase error between a rising edge of the reference clock and a rising edge of the loop feedback clock FBCLK 151. The range of error covered by CNTR stage 113 is the N-multiplier of the DPLL loop, represented by the 8 bits of signal 123. The resolution is the integer clock period of the DCO clock. CNTR stage 113 is essentially a free-running DOWN-counter that resets to N every time it counts down to 1. The counter may be free-running, rather than being synchronous with FREF_CLK 104, because it is not intended to directly capture the operating frequency, but instead is used to calculate phase error directly when combined with the output of FTDC stage 133 or CTDC stage 153.

CTDC stage 153 is used to quantize the phase error, and to measure the phase error with respect to the phases of DCO_CLK 131 (which in this example has 8 phases). The range of CTDC stage 153 is one full DCO clock period, 1T, and the resolution of CTDC stage 153 in this 8-phase example is one-eighth of a DCO clock period, T/8. CTDC stage 153 uses the rising edge of FREF_CLK 104 to latch the states of the phases DCO_CLK 131, identifying the position of the rising edge of FREF_CLK 104 relative to the phases of DCO_CLK 131, and quantizing the position of the 0-to-1 transition. If the DCO output has a 50% duty cycle, as may be the case in many implementations, the 8-bit DCO_CLK signal 131 should roughly include four zeros and four ones at any given point in time, although that is not a requirement of operation of CTDC stage 153. Table 1, below, shows an example of the encoding of the state of DCO_CLK 131 by the output 163 of CTDC stage 153:

TABLE 1

| Input:<br>DCO_CLK[7:0] @ FREF_CLK Rising Edge | Output:<br>CTDC[2:0] |
| --- | --- |
| 11100001 | 000 |
| 11000011 | 001 |
| 10000111 | 010 |
| 00001111 | 011 |
| 00011110 | 100 |
| 00111100 | 101 |
| 01111000 | 110 |
| 11110000 | 111 |

FTDC stage 133 is used to quantize the phase error between the rising edge of FREF_CLK 104 and the rising edge of loop feedback clock FBCLK 151. The range of correction for FTDC stage 133 is two-eighths of a full DCO clock period (2T/8), and the resolution of FTDC stage 133 is ¹⁄₆₄ of a clock period (T/64)—i.e., one-eighth of the resolution of CTDC stage 153. If the rising edge of FREF_CLK 104 edge is within the 2T/8 target window of FTDC stage 133, FTDC stage 133 will output a value of signal 143 between 0 and $14_{10}$; otherwise signal 143 will have a saturated output of $15_{10}$. FTDC stage 133 is designed with a master/slave structure to track the DCO clock period T, so that the relative relationship between the resolution represented by one bit of the FTDC output, and the clock period T, stays constant across the frequency range of DCO 101. Table 2, below, shows an example of the encoding of the state of FTDC stage 133 by signal 143:

TABLE 2

| FTDC output | Phase Error between FREF_CLK and FBCLK |
|---|---|
| 0000 | +7T/64 |
| 0001 | +6T/64 |
| 0010 | +5T/64 |
| 0011 | +T/64 |
| 0100 | +T/64 |
| 0101 | +2T/64 |
| 0110 | +1T/64 |
| 0111 | 0 |
| 1000 | −1T/64 |
| 1001 | −2T/64 |
| 1010 | −3T/64 |
| 1011 | −4T/64 |
| 1100 | −5T/64 |
| 1101 | −6T/64 |
| 1110 | −7T/64 |
| 1111 | Outside Window |

FIGS. 2-5 show four different timing diagrams illustrating operating conditions of a DPLL according to the implementation of FIG. 1. In each of FIGS. 2-5, five phases 201-205 (phases 0-4) of DCO_CLK signal 131 are shown. Phases 5-7 (not shown) are complements of phases 1-3. Phase 0 of the next cycle also is shown at 206. As previously noted, phase 0 (201) is also FBCLK 151.

Each of FIGS. 2-5 also shows a 2T/8-wide target FTDC range 200. The relationship of the reference clock FREF_CLK 104 to the feedback clock FBCLK 151 and the target FTDC range 200 differs in each drawing.

Figure 2:
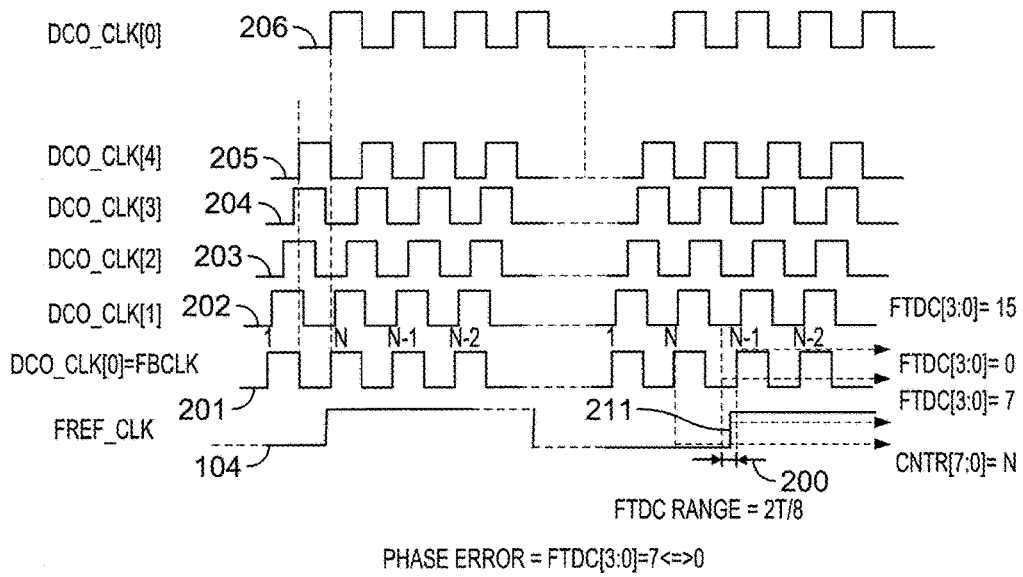
FIG. 2 is a timing diagram showing a first operating condition of a digital phase-locked loop circuit according to FIG. 1.

FIG. 2 shows a case where the loop is locked or close to locking. Output signal 123 of CNTR stage 113 has its expected value. Output signal 143 of FTDC stage 133 is not saturated—i.e., is not equal to $15_{10}$, but rather is between 0 and $14_{10}$, with rising edge 211 of FREF_CLK 104 within the target FTDC range 200. In this case, output signal (FTDC [3:0]) 143 of FTDC stage 133 ranges between '0' and '$7_{10}$' and gives the phase error directly, and neither CNTR stage 113 nor CTDC stage 153 is needed:

$0 \leq FTDC[3:0] \leq 7$

Figure 3:
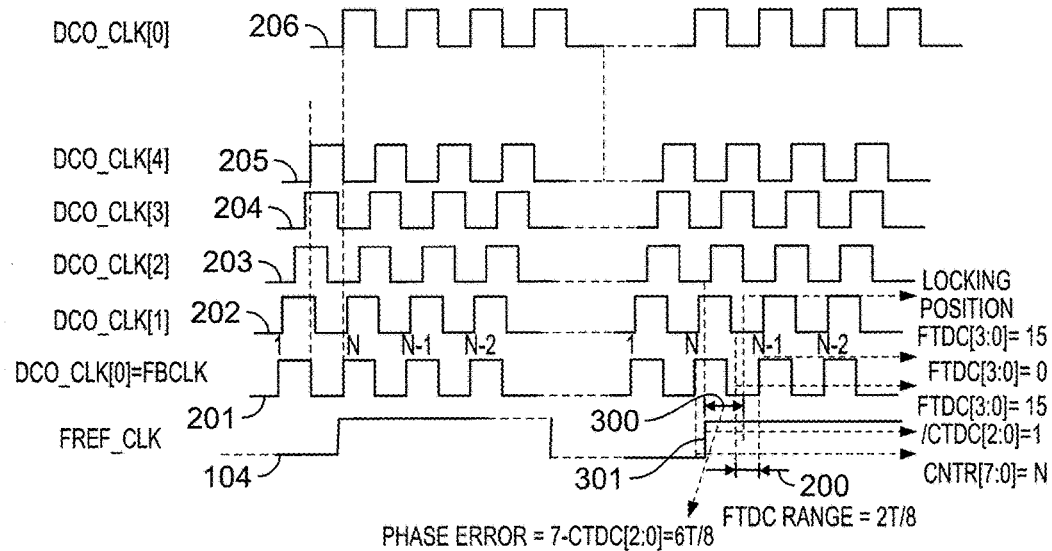
FIG. 3 is a timing diagram showing a second operating condition of a digital phase-locked loop circuit according to FIG. 1.

FIG. 3 shows a case where the loop is not locked, or at least not within the FTDC range, represented by the FTDC being in saturation—i.e., output signal 143 of FTDC stage 133 equals $15_{10}$. However, the phase error 300, represented by the distance between rising edge 301 of FREF_CLK 104 and the center of target FTDC range 200, is less than 1T. In this case, only CTDC information is used to compute phase error, where CTDC=7 would mean no error:

Phase Error=7−CTDC[2:0]=6$T$/8

Figure 4:
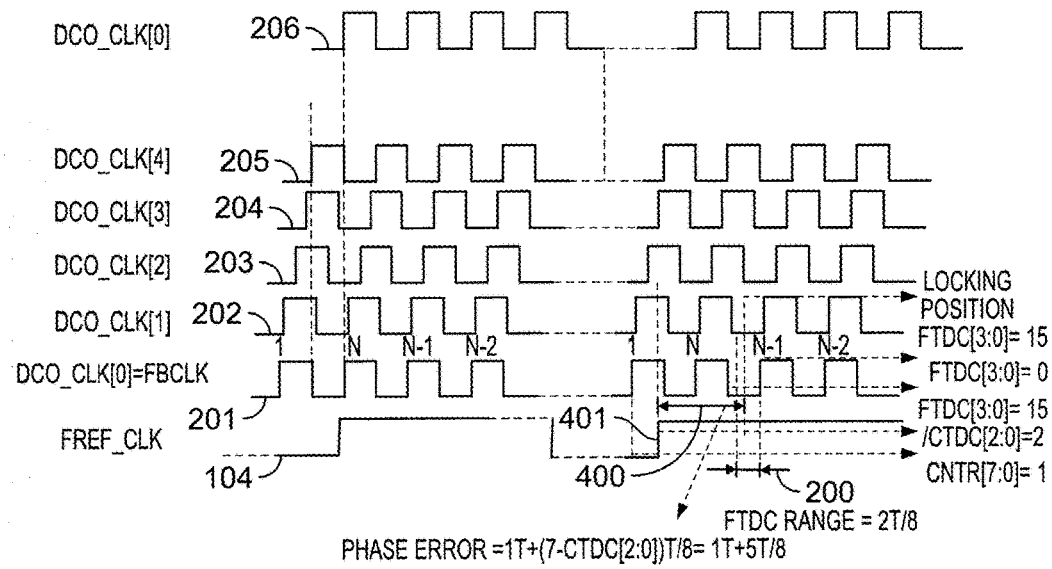
FIG. 4 is a timing diagram showing a third operating condition of a digital phase-locked loop circuit according to FIG. 1.

FIG. 4 shows a case where the loop is not locked, or at least not within the FTDC range, represented by the FTDC being in saturation—i.e., output signal 143 of FTDC stage 133 equals $15_{10}$. However, the phase error 400, represented by the distance between rising edge 401 of FREF_CLK 104 and the center of target FTDC range 200, is greater than 1T. In this case, both CNTR information and CTDC information are used to compute phase error. CNTR indicates the integer number N (in this example, N=1) of time periods T in the phase error when the phase error exceeds 1T, while CTDC indicates the amount of error in excess of NT in multiples—i.e., with a resolution—of T/8:

Phase Error=1$T$+(7−CTDC[2:0])$T$/8=1$T$+5$T$/8

Figure 5:
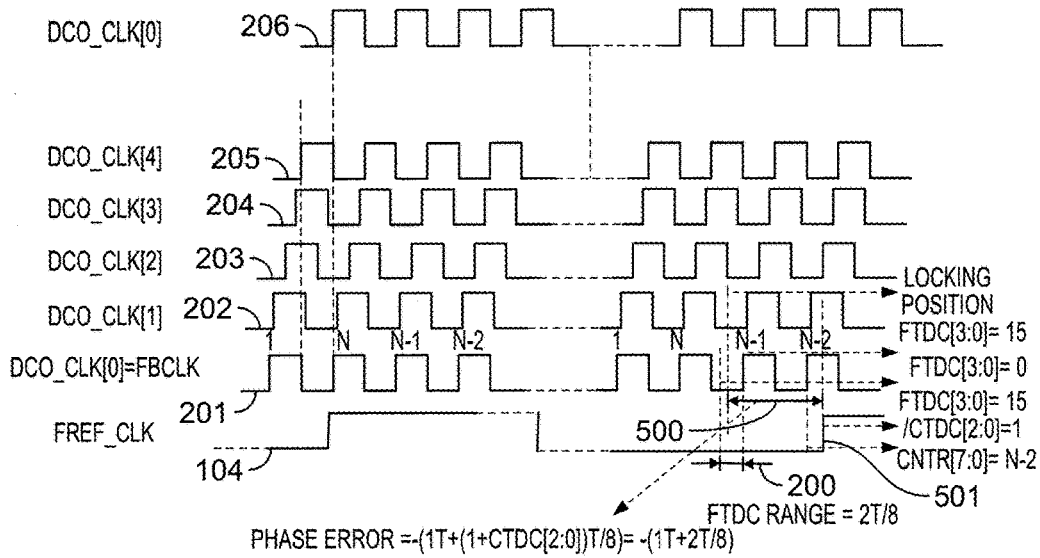
FIG. 5 is a timing diagram showing a fourth operating condition of a digital phase-locked loop circuit according to FIG. 1.

In each of FIGS. 2-4, the loop is slow and the reference clock edge occurs before target locking position so the sign of the correction is positive. FIG. 5 is similar to FIG. 4, with the phase error 500, represented by the distance between rising edge 501 of FREF_CLK 104 and the center of target FTDC range 200, being greater than 1T. However, in this case, the loop is too fast. Therefore, the sign of the loop correction is negative:

Phase Error=−(1$T$+(1+CTDC[2:0])$T$/8)=−(1$T$+2$T$/8)

The discussion in connection with FIGS. 1-5 assumes an integer DPLL—i.e., a DPLL for which the output frequency is an integer multiple of the reference frequency. For a fractional DPLL—i.e., a DPLL for which the output frequency is a rational, but not necessarily integral, multiple of the reference frequency—a different technique is needed to correlate the loop feedback clock with the TDC input clock phases to capture the phase difference resulting from the fraction, so that both the CTDC and the FTDC can be used to lock to the same phase.

Figure 6:
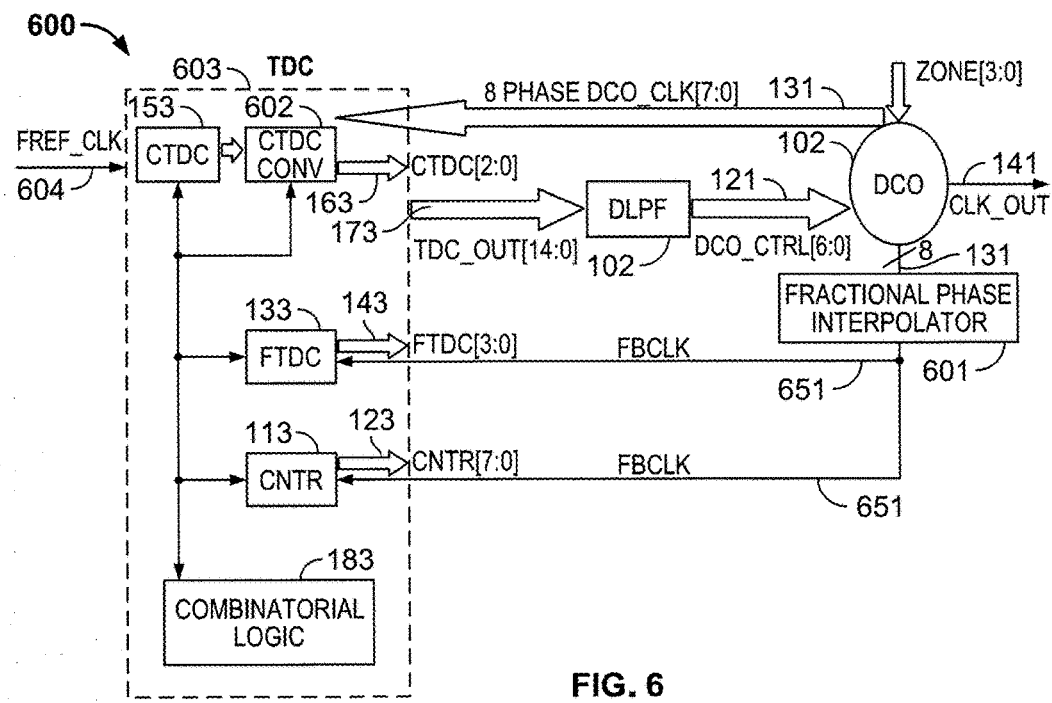
FIG. 6 is a block diagram showing a second implementation of a digital phase-locked loop circuit according to the subject matter of this disclosure.

A second implementation, of a DPLL 600 according to the subject matter of this disclosure, is shown in FIG. 6. DPLL 600 is similar to DPLL 100, except for the presence of fractional phase interpolator 601 and CTDC conversion block 602 in TDC 603.

Fractional phase interpolator 601 implements the fractional portion of the loop target frequency. In one implementation, during every cycle of the reference clock, fractional phase interpolator 601 introduces an additional phase shift, smaller than one clock period, of the DCO clock. For example, if the target loop frequency is (N+0.5) times the DCO clock frequency, then one of the feedback clock cycles would be stretched from 1T to 1.5T. More generally, fractional phase interpolator 601 stretches one cycle from 1T to (1+R)T, where R is the desired fraction to achieve target frequency. The stretching of a cycle may be accomplished by shifting one edge of the cycle by the fractional amount R. The value of R may be user-selectable or controllable.

To implement the phase stretch, fractional phase interpolator 601 selects a clock output phase that is based on current clock phase and the additional stretch amount R. The stretched cycle output phase is the sum of the current clock phase and the fractional amount. For example, if the current interpolator phase is 2T/8, and fraction is 0.5 (i.e., 4T/8), then after the stretched cycle, the phase of fractional phase interpolator 601 will be 6T/8 (i.e., 2T/8+4T/8). On the following reference clock cycle, the phase of fractional phase interpolator 601 will wrap around, modulo-8, and become 2T/8 again after the stretched cycle (6T/8+4T/8=10T/8=2T/8). The current selected phase of the interpolator block may be referred to as INTP_PHASE.

As in the case of any phase-locked loop, the loop locks the feedback clock to the reference clock. In the integral DPLL 100 described above, feedback clock (FBCLK) 151, as well as final loop output (CLK_OUT) 141, was the same as DCO_CLK[0]. In fractional DPLL 600, feedback clock (FBCLK) 651 can be selected by fractional phase interpolator 601 from any of the DCO clock phases, so there is no predetermined relationship between feedback clock (FBCLK) 651 and DCO_CLK[0]. However, DCO_CLK[0] is normally used as the final loop output (CLK_OUT) 141.

The selected feedback clock (FBCLK) 651 has an additional fractional (R) phase difference, as well as a phase difference attributable to the delay introduced by fractional phase interpolator 601 relative to DCO_CLK[0]. So once a CTDC value is determined, an amount that compensates for the fractional (R) phase difference and the interpolator delay must be added to the CTDC value to determine the true phase error in feedback clock (FBCLK) 651 relevant to reference clock (FREF_CLK) 604. This compensation occurs in CTDC conversion block 602.

The compensation component for the fractional (R) phase difference is equivalent to the current interpolator phase (INTP_PHASE), but the interpolator delay (INTP_DLY) must be measured. To do so, initially the loop is operated without the CTDC. Although locking will take longer without the CTDC to narrow down the phase range, a lock can be achieved. Once the loop is locked to within 2T/8, the interpolator delay can be given by:

(INTP_PHASE+INTP_DLY)−CTDC_CODE=0.

With INTP_PHASE known, INTP_DLY is the only unknown and can be calculated arithmetically. Once INTP_DLY has been determined, fractional DPLL 600 can be operated with the CTDC, allowing faster locking for subsequent frequency jumps.

The components of fractional DPLL 600 operate similarly to those of integral DPLL 100. Indeed, DPLL 600 can be used in an integer mode by setting both the fractional interpolator phase R and the compensation in block 602 to '0'. In any case, in fractional DPLL 600, the CTDC stage 153 gives the location of the reference clock edge measured relative to the phases of DCO_CLK[7:0]. The loop error during the CTDC mode (i.e., where 2T/8<phase error<1T) is based on the difference between the CTDC code and the feedback clock edge less 1T/8, because the loop locking point is centered at the feedback clock edge less 1T/8. The fixed offset of −1T/8 is absorbed in the INTP_DLY constant. CTDC converter block 602 computes the phase difference between the reference clock edge and the feedback clock, so that loop error given to the DLPF 102 is always given with respect to the feedback clock edge.

The sign of the error depends on whether the reference clock edge leads or lags the feedback clock edge. If the reference clock edge leads the feedback clock edge, the DCO frequency is slow and the phase error is positive:

PHASE ERROR=(INTP_PHASE+INTP_DLY)−CTDC_Code

If the reference clock edge lags the feedback clock edge, the DCO frequency is fast and the phase error is negative:

PHASE ERROR=−(CTDC_Code−(INTP_PHASE+INTP_DLY)).

Figure 7:
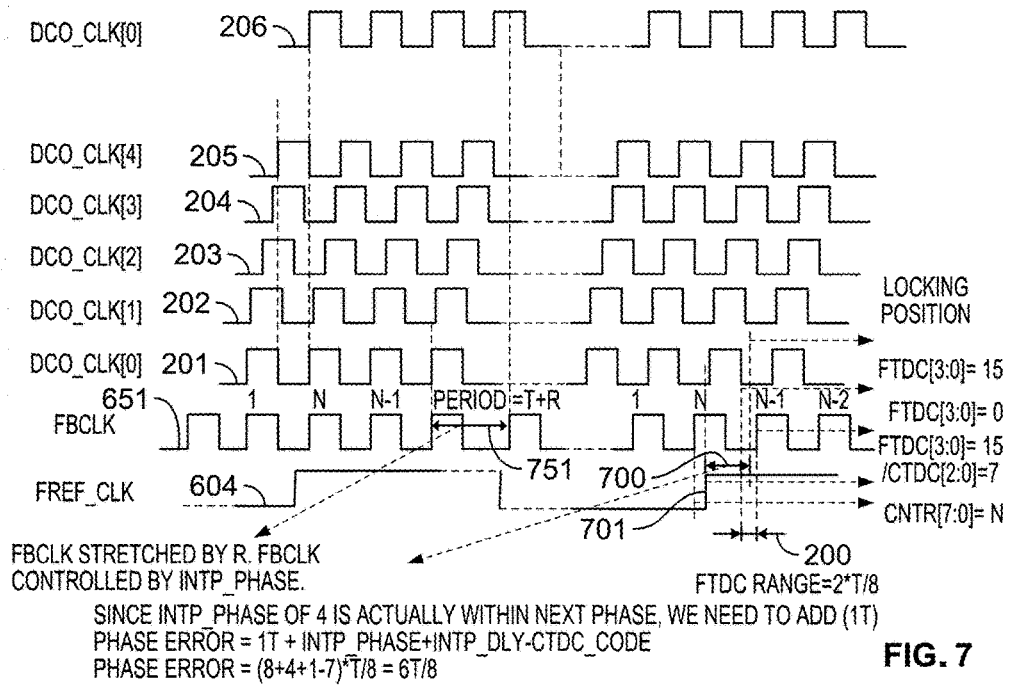
FIG. 7 is a timing diagram showing a first operating condition of a digital phase-locked loop circuit according to FIG. 6.
Figure 8:
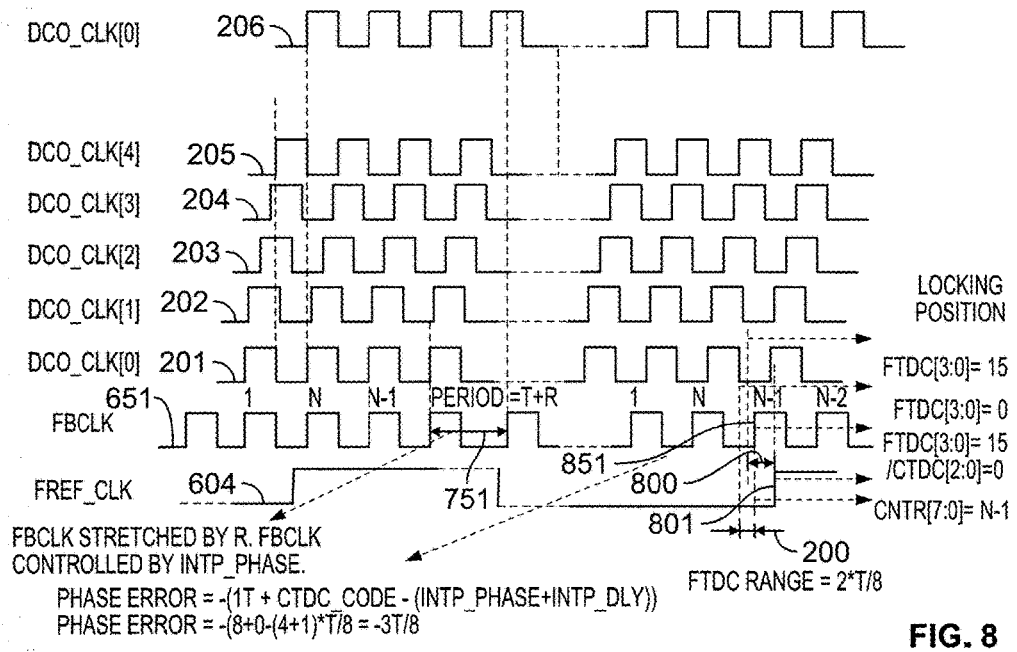
FIG. 8 is a timing diagram showing a second operating condition of a digital phase-locked loop circuit according to FIG. 6.

The operation of fractional DPLL 600 may be understood with reference to the two examples illustrated in the timing diagrams of FIGS. 7 and 8. As in FIGS. 2-5, five phases 201-205 (phases 0-4) of DCO_CLK signal 131 are shown. Phases 5-7 (not shown) are complements of phases 1-3. Phase 0 of the next cycle also is shown at 206.

Each of FIGS. 7 and 8 also shows a 2T/8-wide target FTDC range 200. The relationship of the reference clock FREF_CLK 604 to the feedback clock FBCLK 651 and the target FTDC range 200 differs in each drawing.

FIG. 7 shows a case similar to FIG. 3, above, where the loop is not locked, or at least not within the FTDC range, represented by the FTDC being in saturation—i.e., output signal 143 of FTDC stage 133 equals $15_{10}$. However, the phase error 700, represented by the distance between rising edge 701 of FREF_CLK 604 and the center of target FTDC range 200, is less than 1T. In such case, only CTDC information would be used to compute phase error, but for the fractional shift, which for purposes of this example can be taken to be 0.5 (i.e., 4T/8). As shown in FIG. 7, the DCO clock is slightly slower than target so the rising edge 701 of reference clock (FREF_CLK) 604 is earlier than the rising edge of feedback clock (FBCLK) 651. In the final cycle of feedback clock (FBCLK) 651, as drawn, there is a total phase shift of 6T/8 with respect to DCO_CLK[0]. Of that total phase shift, 4T/8 comes from the 0.5 fractional shift (which occurs in an unseen portion of the phase selected to be FBCLK 651), leaving 2T/8 as the actual delay through the fractional phase interpolator 601. However, because the FTDC as shown has a lock position at FBCLK−1T/8, the effective value of the delay constant (INTP_DLY) is reduced to 1T/8.

When rising edge 701 of reference clock (FREF_CLK) 604 occurs, the CTDC outputs 7T/8. The fractional phase compensation INTP_PHASE is 4T/8. The fractional phase compensation (INTP_PHASE) of 4T/8, along with the delay constant (INTP_DLY) of 1T/8, shifts the prospective edge of the feedback clock (FBCLK) into a new cycle of DCO. Therefore, 1T is added to INTP_PHASE to maintain the rotation direction of the phases—i.e., INTP_PHASE=4T/8 is interpreted as INTP_PHASE=(4T/8+8T/8)=12T/8. Total phase error is then given by:

Phase error=INTP_PHASE+INTP_DLY−CTDC_CODE=12$T$/8+1$T$/8−7$T$/8=6$T$/8

FIG. 8 is similar to FIG. 7, in that the loop is not locked, or at least not within the FTDC range, represented by the FTDC being in saturation—i.e., output signal 143 of FTDC stage 133 equals $15_{10}$, and the phase error 800, represented by the distance between rising edge 801 of FREF_CLK 604 and the center of target FTDC range 200, is less than 1T. However, in this case the DCO clock is slightly faster than target so rising edge 801 of reference clock (FREF_CLK) 604 is later than rising edge 851 of feedback clock (FBCLK) 651. In the final cycle of feedback clock (FBCLK) 651, there is again, as drawn, a total phase shift of 6T/8 with respect to DCO_CLK[0]. Of that total phase shift, 4T/8 comes from the 0.5 fractional shift (which occurs in an unseen portion of the phase selected to be FBCLK 651), leaving 2T/8 as the actual delay through the fractional phase interpolator 601. Again, the FTDC has a lock position at FBCLK−1T/8, so that the effective value of the delay constant (INTP_DLY) is reduced to 1T/8.

When rising edge 801 of reference clock (FREF_CLK) 604 occurs, the CTDC outputs 0. Here, the fractional phase compensation (INTP_PHASE) of 4T/8, along with the delay constant (INTP_DLY), 1T/8 shifts the prospective edge of the feedback clock (FBCLK) into a new cycle of DCO. In this case, 1T is added to the CTDC output to maintain the rotation direction of the phases—i.e., CTDC=0T/8, needs to be interpreted as 0T/8+8T/8=8T/8, which is ahead of the fractional phase compensation INTP_PHASE of 4T/8. Total phase error is given by:

Phase error=−(CTDC_CODE−(INTP_PHASE+INTP_DLY))=−(8$T$/8−(4$T$/8+1$T$/8))=−3$T$/8.

Although not shown, cases similar to FIGS. 2, 4 and 5, but including fractional phase interpolator 601, may occur. Moreover, although separate circuits 100 and 600 are shown for the cases without, and with, respectively, fractional phase interpolator 601, circuit 600 may be operated with a fractional shift R=0, so that a separate circuit 100 may not be needed.

In addition to CNTR stage 113, FTDC stage 133 and CTDC stage 153, TDC 103 also includes combinatorial logic 183 configured to compare actual raw output data from each of CNTR stage 113, FTDC stage 133 and CTDC stage 153, to nominal outputs of CNTR stage 113, FTDC stage 133 and CTDC stage 153 for the locked condition, in order to perform the calculations described above to determine TDC output signal (TDC_OUT) 173. The most significant bit of TDC output signal (TDC_OUT) 173 is a sign bit. The remaining bits of TDC output signal (TDC_OUT) 173 are essentially the concatenation of CNTR output 123 as the most significant bits, CTDC output 163 as the next most significant bits, and the three least significant bits of FTDC output 143 as the least significant bits. The sign bit can come from the most significant bit of FTDC output 143 in a near-locked case where only FTDC output 143 is used (the other components cancel out of TDC output signal (TDC_OUT) 173 and the corresponding bits are '0'). Otherwise, the sign bit is determined by whether the feedback clock (FBCLK) edge is leading or lagging the reference clock edge.

Figure 9:
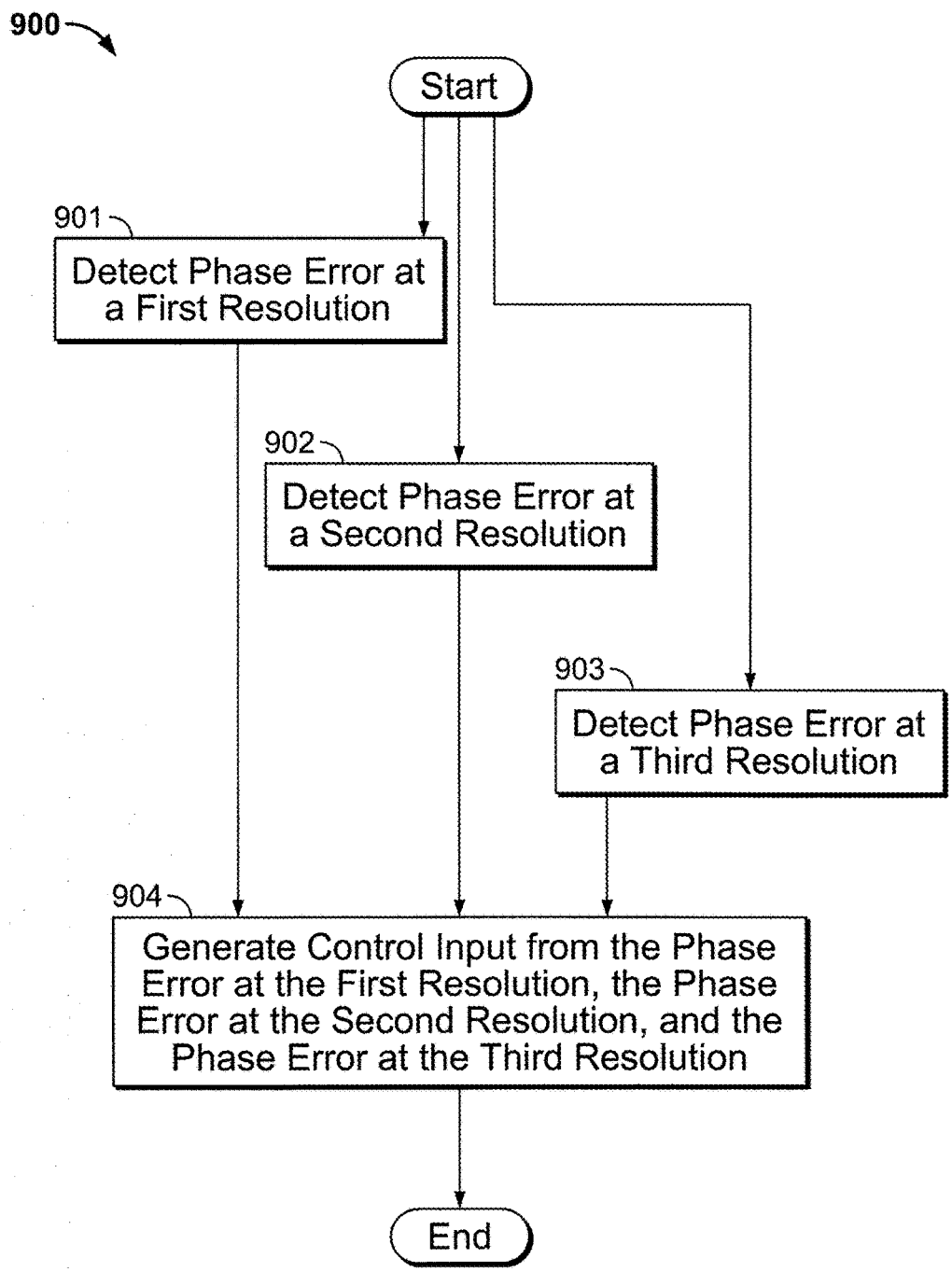
FIG. 9 is a flow diagram of an implementation of a method for controlling a digital locking loop circuit in accordance with the subject matter of this disclosure.

A method 900 for controlling a digital locking loop circuit in accordance with implementations of the subject matter of this disclosure is diagrammed in FIG. 9. At 901, phase error at a first resolution that is integer multiples of a time period of a feedback signal of the digital locking loop circuit is detected. In parallel, at 902, phase error at a second resolution that is a coarse fraction of the time period of the feedback signal of the digital locking loop circuit is detected. In parallel, at 903, phase error at a third resolution that is a fine fraction of the time period of the feedback signal of the digital locking loop circuit, the fine fractions being smaller than the coarse fractions, is detected. At 904, a control input to the digital locking loop circuit is generated from the phase error at the first resolution, the phase error at the second resolution, and the phase error at the third resolution.

Thus it is seen that a digital locking loop circuit in which phase error detection is performed by a time-to-digital converter having several stages that operate in parallel, with each stage having a different range, to measure a different resolution of the phase error, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A digital locking loop circuit comprising:
a digitally-controlled frequency generator;
a digital loop filter configured to output a digital control signal for inputting to the digitally controlled frequency generator; and
a multi-stage time-to-digital converter configured to detect phase error between an input reference clock signal and an output signal fed back from the digitally-controlled frequency generator, and to output the phase error as a control input to the digital loop filter, to cause the digital control signal output by the digital loop filter to adjust the digitally-controlled frequency generator to decrease the phase error; wherein the multi-stage time-to-digital converter includes:
a plurality of phase-error detection stages, each respective phase-error detection stage being configured to detect a respective phase error component at a respective resolution; and
combinatorial logic configured to combine the respective phase error components into a phase error signal.

2. The digital locking loop circuit of claim 1 wherein the plurality of phase-error detection stages comprises:
a first phase-error detection stage configured to detect phase error at a first resolution that is integer multiples of a time period of the output signal fed back from the digitally-controlled frequency generator;
a second phase-error detection stage configured to detect phase error at a second resolution that is a coarse fraction of the time period of the output signal fed back from the digitally-controlled frequency generator; and
a third phase-error detection stage configured to detect phase error at a third resolution that is a fine fraction of the time period of the output signal fed back from the digitally-controlled frequency generator, the fine fractions being smaller than the coarse fractions.

3. The digital locking loop circuit of claim 2 wherein:
the output signal fed back from the digitally-controlled frequency generator comprises a plurality of output phases;
the second phase-error detection stage operates on the plurality of output phases; and
the coarse fraction comprises a respective period of one the output phases.

4. The digital locking loop circuit of claim 3 wherein the first phase-error detection stage and the third phase-error detection stage both operate on a particular one of the plurality of output phases.

5. The digital locking loop circuit of claim 4 wherein:
the digitally-controlled frequency generator is a digitally-controlled oscillator configured to change its frequency in response to a digital control signal, whereby the digital locking loop circuit is a digital phase-locked loop circuit having an adjustable target frequency;
the digital phase-locked loop circuit further comprises a fractional phase interpolator on the particular one of the plurality of output phases, the fractional phase interpolator being configured to adjust the target frequency by a fractional amount; and
the second stage comprises conversion circuitry configured to compensate for a fractional phase on the particular one of the plurality of output phases.

6. The digital phase-locked loop circuit of claim 5 wherein the conversion circuitry is configured to determine a phase error attributable to the fractional phase interpolator and a delay attributable to the fractional phase interpolator.

7. The digital locking loop circuit of claim 3 wherein:
the coarse fraction bears a particular proportion to the time period; and
the fine fraction bears the particular proportion to the coarse fraction.

8. The digital locking loop circuit of claim 3 wherein the plurality of stages operate in parallel to provide different portions of the phase error signal.

9. The digital locking loop circuit of claim 1 wherein:
the digitally-controlled frequency generator is a digitally-controlled oscillator, whereby the digital locking loop circuit is a digital phase-locked loop circuit having an adjustable target frequency;
the digital phase-locked loop circuit further comprises a fractional phase interpolator configured to adjust the target frequency by a fractional amount, by shifting an edge of at least one cycle of the output signal fed back from the digitally-controlled oscillator; and
at least one stage of the plurality of stages comprises conversion circuitry configured to compensate for a fractional phase on the output signal fed back from the digitally-controlled oscillator.

10. The digital locking loop circuit of claim 1 wherein the plurality of stages operate in parallel to provide different portions of the phase error signal.

11. The digital locking loop circuit of claim 1 wherein the digitally-controlled frequency generator is a digitally-controlled oscillator configured to change its frequency in response to a digital control signal, whereby the digital locking loop circuit is a digital phase-locked loop circuit.

12. The digital locking loop circuit of claim 1 wherein the digitally-controlled frequency generator is a digital delay line including a plurality of controllable delay elements, whereby the digital locking loop circuit is a digital delay-locked loop circuit.

13. A method for controlling a digital locking loop circuit, the method comprising:
   detecting phase error at a first resolution that is integer multiples of a time period of a feedback signal of the digital locking loop circuit;
   detecting phase error at a second resolution that is a coarse fraction of the time period of the feedback signal of the digital locking loop circuit;
   detecting phase error at a third resolution that is a fine fraction of the time period of the feedback signal of the digital locking loop circuit, the fine fractions being smaller than the coarse fractions; and
   combining the phase error at the first resolution, the phase error at the second resolution, and the phase error at the third resolution, into a phase error signal that is a control input to the digital locking loop circuit.

14. The method of claim 13 wherein:
   detecting phase error at the second resolution comprises operating on a plurality of output signal phases; and
   the coarse fraction comprises a respective period of one the output signal phases.

15. The method of claim 14 wherein both the detecting phase error at the first resolution, and the detecting phase error at the third resolution, comprise operating on a particular one of the plurality of output phases.

16. The method of claim 15 further comprising:
   interpolating a fractional phase of the particular one of the plurality of output phases fed back from the digitally-controlled oscillator by shifting an edge of at least one cycle of the particular one of the plurality of output phases, to adjust the target frequency by a fractional amount; wherein:
   detecting phase error at the second resolution further comprises compensating for the fractional phase on the particular one of the plurality of output phases.

17. The method of claim 16 wherein the compensating for the fractional phase comprises determining a phase error attributable to interpolation of the fractional phase and a delay attributable to interpolation of the fractional phase.

18. The method of claim 13 wherein the detecting phase error at the first resolution, the detecting phase error at the second resolution, and the detecting phase error at the third resolution, are performed in parallel to provide different portions of the phase error signal.

19. The method of claim 13 further comprising:
   interpolating a fractional phase on the feedback signal of the digital locking loop circuit by shifting an edge of at least one cycle of the feedback signal; wherein:
   the generating a control input comprises compensating for the fractional phase on the feedback signal of the digital locking loop circuit.

20. The method of claim 19 wherein the compensating for the fractional phase comprises determining a phase error attributable to interpolation of the fractional phase and a delay attributable to interpolation of the fractional phase.

* * * * *